(12) United States Patent
Bang et al.

(10) Patent No.: US 12,230,516 B2
(45) Date of Patent: Feb. 18, 2025

(54) SUBSTRATE TREATING APPARATUS AND SUBSTRATE TREATING METHOD

(71) Applicant: SEMES CO., LTD., Chungcheongnam-do (KR)

(72) Inventors: Jae Oh Bang, Seoul (KR); Young Seo An, Gyeonggi-do (KR); Seung Han Lee, Chungcheongnam-do (KR); Seung Hwan Lee, Chungcheongnam-do (KR); Hyun Min Kim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 775 days.

(21) Appl. No.: 17/515,737

(22) Filed: Nov. 1, 2021

(65) Prior Publication Data
US 2022/0139738 A1    May 5, 2022

(30) Foreign Application Priority Data

Nov. 2, 2020    (KR) .................. 10-2020-0144342

(51) Int. Cl.
*H01L 21/67* (2006.01)
*F27B 17/00* (2006.01)
(Continued)

(52) U.S. Cl.
CPC .... *H01L 21/67109* (2013.01); *F27B 17/0025* (2013.01); *F27D 7/02* (2013.01);
(Continued)

(58) Field of Classification Search
CPC ............. H01L 21/67109; H01L 21/324; H01L 21/67253; H01L 22/20; F27B 17/0025;
(Continued)

(56) References Cited

U.S. PATENT DOCUMENTS

2015/0227050 A1*  8/2015  Lin ................... H01L 21/67115
                                                              438/5

FOREIGN PATENT DOCUMENTS

JP    H10-223516 A    8/1998
JP    2001-358049 A   12/2001
(Continued)

OTHER PUBLICATIONS

Office Action dated Feb. 1, 2023 issued by the Korean Patent Office in corresponding KR Patent Application No. 10-2020-0144342, pp. 1-12, with English translation.

(Continued)

*Primary Examiner* — Phuong T Nguyen
(74) *Attorney, Agent, or Firm* — Carter, DeLuca & Farrell LLP

(57) ABSTRACT

The inventive concept relates to a substrate treating apparatus including a process chamber having a first and a second body, a support unit supporting a substrate, a heating unit heats the substrate, a driver moves any one of the first body and the second body, an interval state detection unit that detects an interval state between a side wall of the first body and a side wall of the second body when the first and the second body are placed in a process location, and a controller that controls the driver and the interval state detection unit, wherein the interval state detection unit includes a pressure provision line that provides a positive pressure or a negative pressure between the side wall of the first body and the side wall of the second body, and a pressure measurement member that measures a change in a pressure of the pressure provision line.

15 Claims, 11 Drawing Sheets

(51) Int. Cl.
*F27D 7/02* (2006.01)
*F27D 99/00* (2010.01)
*H01L 21/324* (2006.01)
*H01L 21/66* (2006.01)
*F27D 5/00* (2006.01)
*F27D 19/00* (2006.01)

(52) U.S. Cl.
CPC ........ *F27D 99/0073* (2013.01); *H01L 21/324* (2013.01); *H01L 21/67253* (2013.01); *H01L 22/20* (2013.01); *F27D 5/0037* (2013.01); *F27D 2019/0084* (2013.01)

(58) Field of Classification Search
CPC ...... F27D 7/02; F27D 99/0073; F27D 5/0037; F27D 2019/0084
USPC ....................................................... 219/444.1
See application file for complete search history.

(56) References Cited

FOREIGN PATENT DOCUMENTS

| | | |
|---|---|---|
| JP | 2002-280282 A | 9/2002 |
| JP | 2006-091127 A | 4/2006 |
| JP | 2019161087 A | 9/2019 |
| KR | 20170006779 A | 1/2017 |
| KR | 10-2017-0056224 A | 5/2017 |
| KR | 10-2017-0106792 A | 9/2017 |
| KR | 10-2019-0090925 A | 8/2019 |
| KR | 10-2184055 B1 | 11/2020 |

OTHER PUBLICATIONS

Written Decision on Registration dated May 23, 2023 issued by the Korean Patent Office in corresponding KR Patent Application No. 10-2020-0144342, pp. 1-6, with English translation.

Office Action dated Sep. 20, 2022 issued by the Japan Patent Office in corresponding Japan Patent Application No. 2021-175230, pp. 1-6, with English translation.

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0144342 filed on Nov. 2, 2020, in the Korean Intellectual Property Office, the entire contents of which are hereby incorporated by reference.

BACKGROUND

Embodiments of the inventive concept described herein relate to a substrate treating apparatus and a substrate treating method.

In general, in order to manufacture a semiconductor device, various processes such as a cleaning process, a deposition process, a photolithography process, an etching process, and an ion implantation process are performed. The photolithography process performed to form a pattern plays an important role in achieving high integration of the semiconductor device. The photolithography process is performed to form a photoresist pattern on a semiconductor substrate made of silicon. The photolithography process includes a coating and soft bake process for forming a photoresist film on a substrate, an exposure and development process for forming a photoresist pattern from the photoresist film, an edge bead removal (EBR) process and an edge exposure of wafer (EEW) process for removing an edge portion of the photoresist film or the pattern, and a hard bake process for stabilizing or densifying a photoresist pattern.

A bake process is a process that heats the substrate. In the bake process, a chamber is provided to form a process space in which the substrate is treated. In general, the chamber used in the bake process has two bodies and has a process space formed therein by combining the two bodies. When the substrate is carried into or out from the process space, the chamber is opened, and while the bake process is progressed in the process space, the chamber is closed. However, when the chamber is opened and is then closed, it is difficult to identify whether or not the chamber is situated in a correct location.

In particular, when the bake process is progressed in a state in which the bodies are spaced apart from each other, it is difficult to identify whether or not the bodies are spaced apart from each other by a preset interval and whether or not the bodies are tilted or biased to one side.

SUMMARY

Embodiments of the inventive concept provide a substrate treating apparatus and a substrate treating method capable of identifying whether or not an interval between process chambers is a preset interval.

Further, embodiments of the inventive concept provide a substrate treating apparatus and a substrate treating method capable of identifying whether or not an interval between process chambers is uniform.

The aspect of the inventive concept not limited thereto, and other unmentioned aspects of the inventive concept may be clearly appreciated by those skilled in the art from the following descriptions.

The inventive concept provides a substrate treating apparatus. According to an embodiment, a substrate treating apparatus includes a process chamber having a first body and a second body which are combined with each other to have a treatment space therein, a support unit located inside the treatment space and supporting a substrate, a heating unit that heats the substrate placed on the support unit, a driver that moves any one of the first body and the second body to move the first body and the second body between a process location and an open location, an interval state detection unit that detects an interval state between a side wall of the first body and a side wall of the second body when the first body and the second body are placed in the process location, and a controller that controls the driver and the interval state detection unit, wherein the interval state detection unit includes a pressure provision line that provides a positive pressure or a negative pressure between the side wall of the first body and the side wall of the second body, and a pressure measurement member that measures a change in a pressure of the pressure provision line, and wherein the controller determines whether or not the interval state is defective on the basis of the pressure measured by the pressure measurement member.

In one embodiment, when it is determined that the interval state is defective, the controller may control the driver and the interval state detection unit so that the first body or the second body is moved.

In one embodiment, the pressure provision line may include a main line connected to a pressure supply source, and a branch line branched off from the main line and connecting the main line and a fluid hole provided in the side wall of the first body.

In one embodiment, pressures of fluids flowing in the branch lines may be the same.

In one embodiment, the pressure supply source may supply a fluid to the main line.

In one embodiment, the interval state detection unit may spray the fluid in a vertical direction toward a surface on which the side walls of the first body and the second body face each other.

In one embodiment, the pressure supply source may be a pressure reduction member.

In one embodiment, the interval state detection unit may further include an interval detection plate installed on a surface, facing the side wall of the second body, of the side wall of the first body, and the pressure provision line may provide the positive pressure or the negative pressure between the side wall of the first body and the side wall of the second body through a fluid hole formed in the interval detection plate.

In one embodiment, a thickness of the interval detection plate may be the same as an interval between the side wall of the first body and the side wall of the second body facing each other in the process location.

In one embodiment, a plurality of interval detection plates may be provided along the side wall of the first body.

In one embodiment, the pressure measurement member may include a differential pressure gauge that measures a pressure difference between the pressure provision line and external air.

In one embodiment, the controller may control the driver so that, while the substrate is treated inside the treatment space, an interval between the side wall of the first body and the side wall of the second body is maintained in a preset interval.

In one embodiment, the substrate treating apparatus may further include a gas supply unit that forms a gas curtain by spraying gas to the first body or the second body toward facing side surfaces of the first body and the second body, wherein the gas supply unit includes a plurality of gas supply holes formed in a side surface of the first body or the second body, and a gas supply line that is connected to a gas supply source and supplies the gas to the gas supply holes.

In one embodiment, the treating of the substrate may be bake treatment.

Further, embodiments of the inventive concept provide a substrate treating method. According to an embodiment, a substrate treating method includes heat-treating a substrate at a process location in which the substrate is provided inside a second body and an interval between a side wall of a first body and a side wall of the second body is maintained in a preset interval, and detecting an interval before the heat-treating of the substrate, wherein in the detecting of the interval, an interval state detection unit sprays a fluid toward a surface facing the first body and the second body, measures a pressure of the fluid, determines, on the basis of the pressure, an interval state between the side wall of the first body and the side wall of the second body when the first body and the second body are situated in the process location, and when it is determined that the interval state is defective, moves the first body or the second body.

In one embodiment, the interval state detection unit may include a pressure provision line that provides a fluid to a surface facing the side wall of the first body and the side wall of the second body, and a pressure measurement member that measures a change in a pressure of the pressure provision line, and the pressure provision line may include a main line connected to a pressure supply source, and a branch line branched off from the main line and connecting the main line and a fluid hole formed in the side wall of the first body.

In one embodiment, the interval state detection unit may further include an interval detection plate installed on a surface, facing the side wall of the second body, of the side wall of the first body, wherein the pressure provision line may provide the fluid between the side wall of the first body and the side wall of the second body through a fluid hole formed in the interval detection plate, and wherein a thickness of the interval detection plate may be provided to be the same as an interval between the side wall of the first body and the side wall of the second body facing each other in the process location.

In one embodiment, the substrate treating method may further include forming a gas curtain that prevents an external gas from being introduced into a region in which the substrate is provided through surfaces facing the side wall of the first body and the side wall of the second body during the heat-treating.

In one embodiment, the heat-treating of the substrate may be bake treatment.

Further, embodiments of the inventive concept provide a substrate treating apparatus. According to an embodiment, the substrate treating apparatus includes a process chamber having an upper body and a lower body which are combined with each other to have a treatment space therein in which bake treatment is performed on a substrate, a support unit located inside the treatment space and supporting the substrate, a heating unit that heats the substrate placed on the support unit, a driver that moves any one of the upper body and the lower body to move the upper body and the lower body between a process location and an open location, an interval state detection unit that detects an interval state between a side wall of the upper body and a side wall of the lower body when the upper body and the lower body are placed on the process location, and a controller that controls the driver and the interval state detection unit, wherein the interval state detection unit includes a pressure provision line that provides a fluid in a vertical direction toward a surface on which the side wall of the upper body and the side wall of the lower body face each other, and a pressure measurement member that measures a change in a pressure of the pressure provision line, wherein the pressure provision line includes a main line connected to a pressure supply source, and a branch line branched off from the main line and connecting the main line and a fluid hole formed in the side wall of the upper body, wherein the pressure measurement member measures a change in a pressure of the branch line, wherein the interval state detection unit further includes an interval detection plate installed on a surface, facing the side wall of the lower body, of the side wall of the upper body, wherein the pressure provision line provides the fluid between the side wall of the upper body and the side wall of the lower body through a fluid hole formed in the interval detection plate, wherein a thickness of the interval detection plate is provided to be the same as an interval between the side wall of the upper body and the side wall of the lower body facing each other in the process location, wherein the controller controls the driver and the interval state detection unit so that, while the substrate is treated inside the treatment space, an interval between the upper body and the lower body is maintained in a preset interval, and so that an interval state is determined on the basis of the pressure measured by the pressure measurement member, and when it is determined that the interval state is defective, the upper body or the lower body is moved.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for an ordinary person skilled in the art more completely. Accordingly, the shapes of the components of the drawings are exaggerated to emphasize clearer description thereof.

Figure 1:
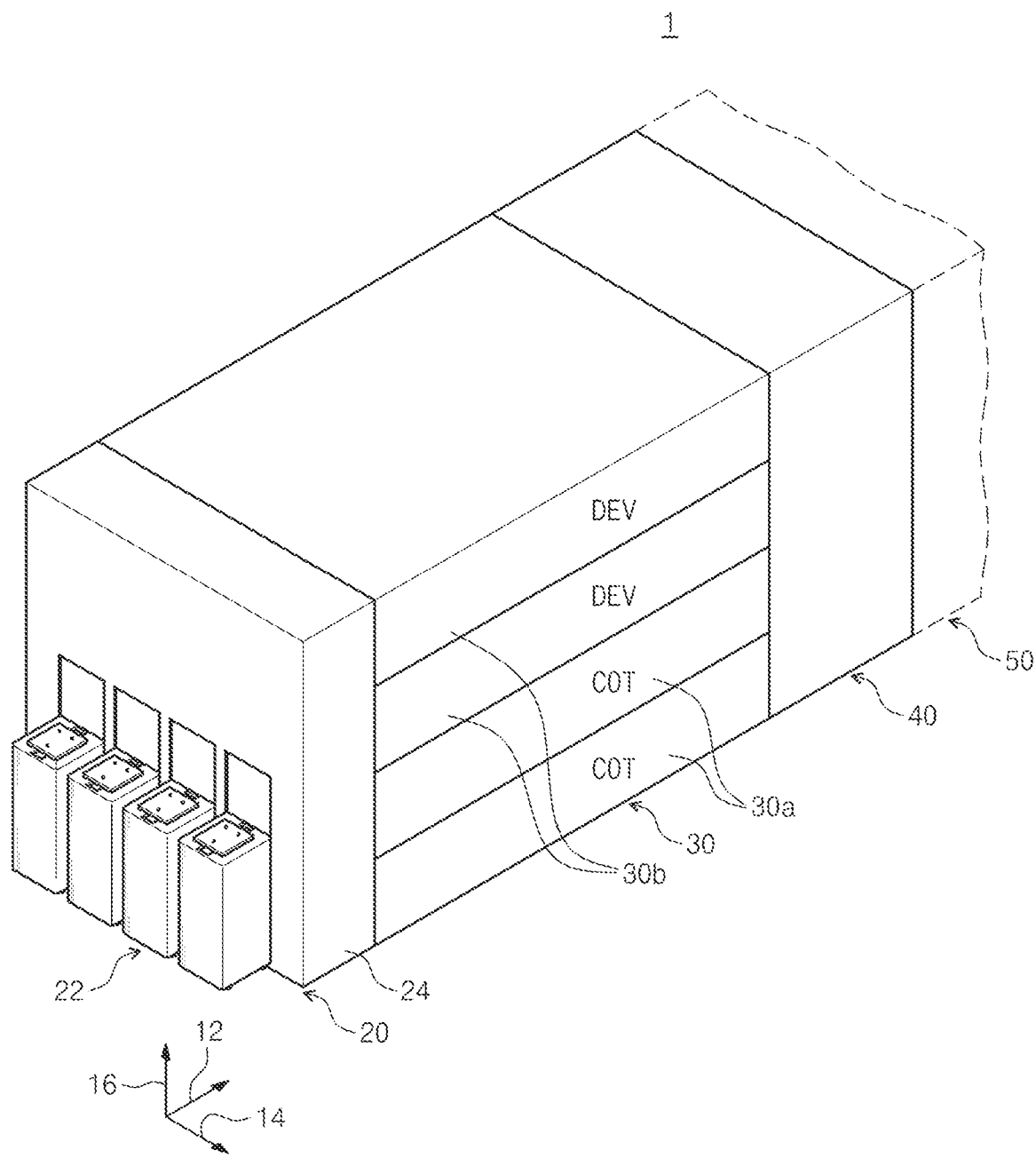
FIG. 1 is a perspective view schematically illustrating a substrate treating apparatus according to one embodiment of the inventive concept.
Figure 2:
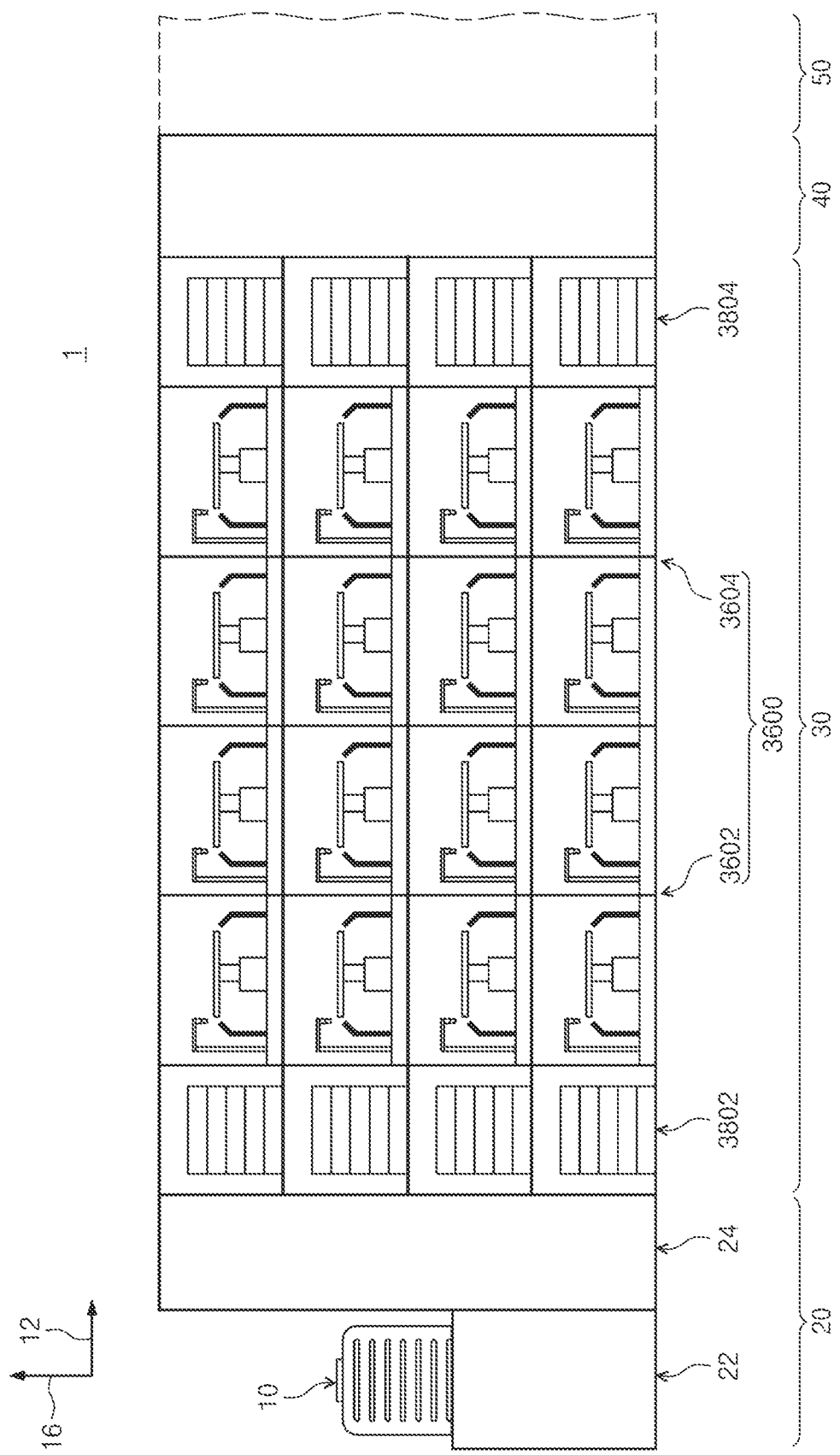
FIG. 2 is a cross-sectional view of the substrate treating apparatus illustrating an application block or a development block of FIG. 1.
Figure 3:
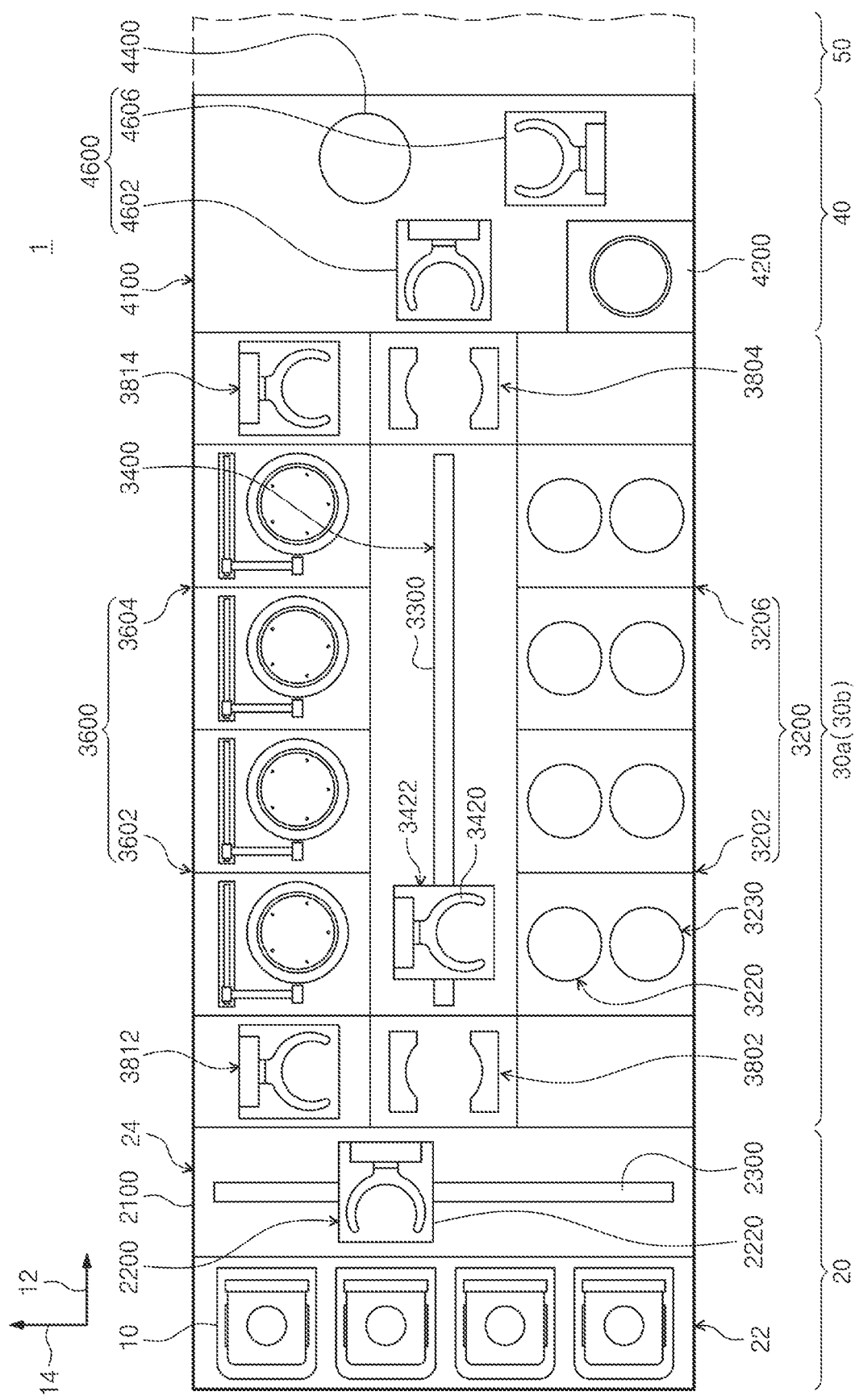
FIG. 3 is a plan view of the substrate treating apparatus in FIG. 1.

FIG. 1 is a perspective view schematically illustrating a substrate treating apparatus according to one embodiment of the inventive concept, FIG. 2 is a cross-sectional view of the substrate treating apparatus illustrating an application block or a development block of FIG. 1, and FIG. 3 is a plan view of the substrate treating apparatus in FIG. 1.

Referring to FIGS. 1 to 3, a substrate treating apparatus 1 includes an index module 20, a treating module 30, and an interface module 40. According to one embodiment, the index module 20, the treating module 30, and the interface module 40 are sequentially arranged in a line. Hereinafter, a direction in which the index module 20, the treating module 30, and the interface module 40 are arranged refers to a first direction 12, a direction that is perpendicular to the first direction 12 when viewed from the top refers to a second direction 14, and a direction that is perpendicular to both the first direction 12 and the second direction 14 refers to a third direction 16.

The index module 20 transfers the substrate "W" to the treating module 30 from a container 10 in which the substrate "W" is accommodated and accommodates the completely treated substrate "W" in the container 10. A lengthwise direction of the index module 20 is provided as the second direction 14. The index module 20 has a load pot 22 and an index frame 24. The load pot 22 is located on a side opposite to the treating module 30 with respect to the index frame 24. The container 10 in which the substrates "W" are accommodated is placed on the load pot 22. The load pot 22 may be provided as a plurality of load pots 22, and the plurality of load pot 22 may be arranged in the second direction 14.

The sealed container 10 such as a front open unified pod (FOUP) may be used as the container 10. The container 10 may be placed in the load pot 22 by an operator or a transfer unit (not illustrated) such as an overhead transfer, an overhead conveyor, or an automatic guided vehicle.

An index robot 2200 is provided inside the index frame 24. A guide rail 2300 having a lengthwise direction provided in the second direction 14 may be provided in the index frame 24, and the index robot 2200 may be provided to be movable on the guide rail 2300. The index robot 2200 may include a hand 2220 on which the substrate "W" is placed, and the hand 2220 may be provided to move forward or rearward, rotate about the third direction 16, and move in the third direction 16.

The treating module 30 performs an application process and a development process on the substrate "W". The treating module 30 has an application block 30a and a development block 30b. The application block 30a performs the application process on the substrate "W", and the development block 30b performs the development process on the substrate "W". The application block 30a is provided as a plurality of application blocks 30a, which are provided to be stacked on each other. The development block 30b is provided as a plurality of development blocks 30b, and the plurality of development blocks 30b are stacked on each other. According to an embodiment of FIG. 1, two application blocks 30a are provided, and two development blocks 30b are provided. The application blocks 30a may be arranged below the development blocks 30b. According to an example, the two application blocks 30a may perform the same process and may be provided to have the same structure. Further, the two development blocks 30b may perform the same process and may be provided to have the same structure.

Referring to FIG. 3, the application block 30a has a heat treating chamber 3200, a transfer chamber 3400, a liquid treating chamber 3600, and a buffer chamber 3800. The heat treating chamber 3200 performs a heat treatment process on the substrate "W". The heat treatment process may include a cooling process and a heating process. The liquid treating chamber 3600 forms a liquid film by supplying a liquid onto the substrate "W". The liquid film may be a photoresist film or an anti-reflective film. The transfer chamber 3400 transfers the substrate "W" between the heat treating chamber 3200 and the liquid treating chamber 3600 inside the application block 30a.

The transfer chamber 3400 is provided so that a lengthwise direction thereof is parallel to the first direction 12. The transfer chamber 3400 is provided with a transfer robot 3422. The transfer robot 3422 transfers the substrate "W" between the heat treating chamber 3200, the liquid treating chamber 3600, and the buffer chamber 3800. According to an example, the transfer robot 3422 may have a hand 3420 on which the substrate "W" is placed, and the hand 3420 may be provided to move forward or rearward, rotate about the third direction 16, and move in the third direction 16. A guide rail 3300 having a lengthwise direction provided in parallel to the first direction 12 may be provided in the transfer chamber 3400, and the transfer robot 3422 may be provided to be movable on the guide rail 3300.

The heat treating chamber 3200 is provided as a plurality of heat treating chambers 3200. The heat treating chambers 3200 are arranged in a row in the first direction 12. The heat treating chambers 3200 are located on one side of the transfer chamber 3400.

Figure 4:
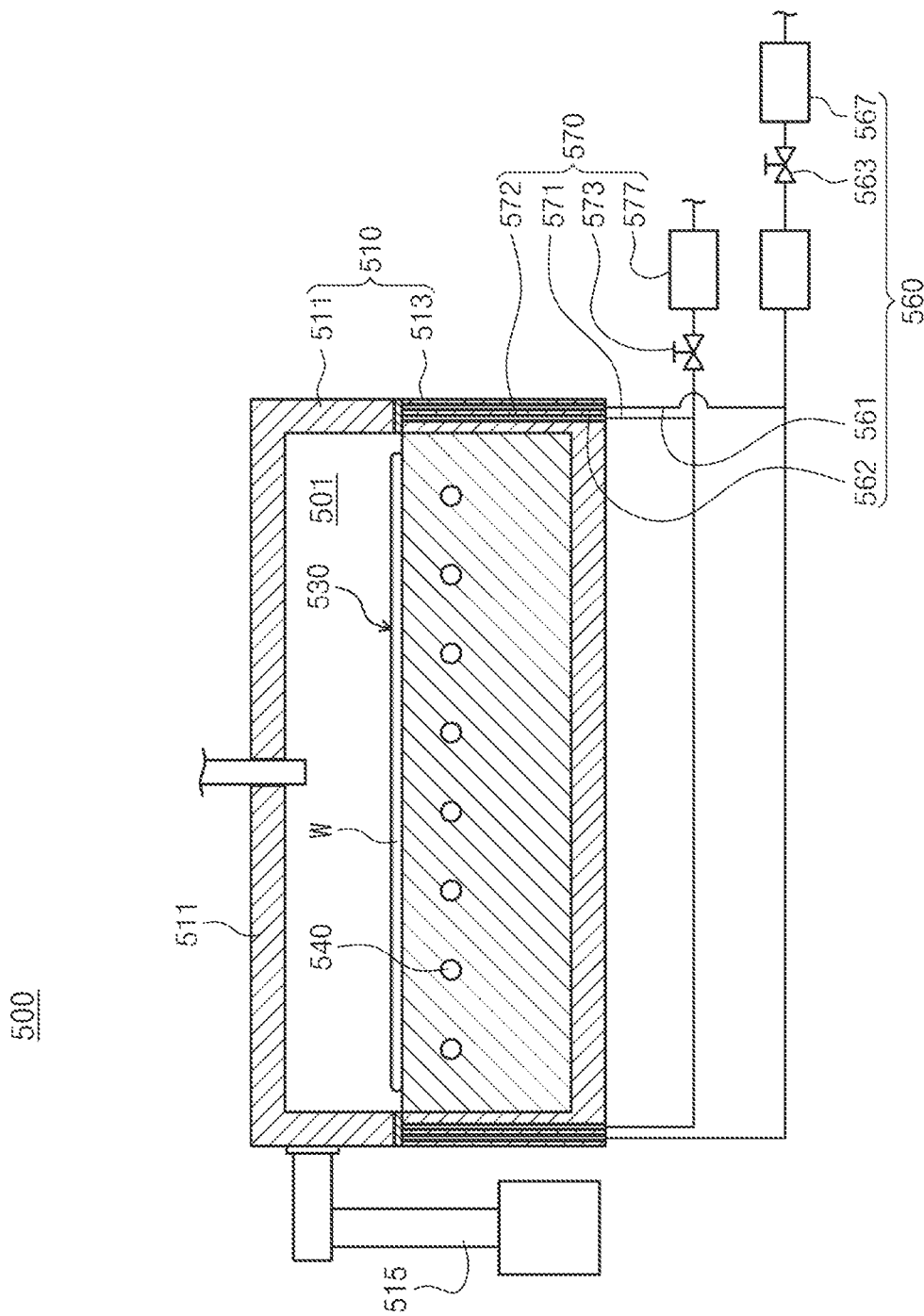
FIG. 4 is a cross-sectional view illustrating the substrate treating apparatus according to one embodiment of the inventive concept.

FIG. 4 is a cross-sectional view illustrating a substrate treating apparatus according to one embodiment of the inventive concept. The substrate treating apparatus of FIG. 4 may be one of heating units 3230 provided in some of the heat treating chambers 3200 of FIG. 1.

Referring to FIG. 4, a substrate treating apparatus 500 includes a process chamber 510, a support unit 530, a heating unit 540, a gas introduction unit 550, an exhaust member (not illustrated), a gas supply unit 570, and an interval state detection unit 560.

The process chamber 510 provides a treatment space 501 therein. The process chamber 510 may have a cylindrical shape. Alternatively, the process chamber 510 may be provided in a rectangular parallelepiped shape. The process chamber 510 includes a first body 513 and a second body 511. The first body 513 and the second body 511 are combined with each other to form the treatment space 501 therein. In one example, the first body 513 and the second body 511 may be arranged in a vertical direction with respect to each other. For example, the second body 511 may be provided as an upper body located above the first body 513, and the first body 513 may be provided as a lower body located below the second body 511. In one example, the first body 513 is provided in a circular shape when viewed from the top. Similarly, the second body 511 is provided in a circular shape when viewed from the top.

A driver 515 moves the first body 513 or the second body 511. The driver 515 may move one of the first body 513 and the second body 511 to change a relative distance between the first body 513 and the second body 511. Selectively, the driver 515 may move both the first body 513 and the second body 511 to change the relative distance between the first body 513 and the second body 511. In one example, the driver 515 is connected to the second body 511. The driver 515 may elevate the second body 511 upward or downward. In one example, the driver 515 is provided to adjust the height and the horizontality of the second body 511. In one example, the driver 515 moves the process chamber 510 between a process location and an open location. For example, the driver 515 lowers the second body 511 so that the second body 511 is situated in the process location and raises the second body 511 so that the second body 511 is situated in the open location. In one example, the process location is a location where the substrate "W" is baked inside the process chamber 510. In one example, the process location may be a location in which the first body 513 and the second body 511 are spaced apart from each other by a predetermined interval. For example, an interval between the facing side surfaces of the first body 513 and the second body 511 in the process location may be 1 mm to 10 mm. In one example, the open location is a location in which, when the substrate "W" is carried into or out from the process chamber 510, the driver 515 moves the second body 511 upward to open the inside of the process chamber 510. In the present embodiment, an example has been described in which the driver 515 is provided in connection with the second body 511. However, unlike this, the driver 515 may be connected to the first body 513 and may elevate the first body 513.

The support unit 530 supports the substrate "W". The support unit 530 is located inside the treatment space 501. The support unit 530 is provided in a circular shape when viewed from the top. An upper surface of the support unit 530 may have a larger cross section than that of the substrate "W". The support unit 530 may be made of a material having high thermal conductivity. The support unit 530 may be made of a material having excellent heat resistance.

The heating unit 540 heats the substrate "W" placed on the support unit 530. The heating unit 540 may be located inside the support unit 530. As one example, the heating unit 540 may be provided as a heater. In one example, the heater may be provided as a heating wire forming a pattern in the support unit 530. Unlike this, the heater may be provided as a lamp or the like.

The exhaust member (not illustrated) exhausts the treatment space 501 or the periphery of the treatment space 501. Here, a peripheral part of the treatment space 501 is defined as a space between the first body 513 and the second body 511. The exhaust member (not illustrated) may include a hole formed in the first body 513 or the second body 511 and a pressure reduction member that reduces the pressure of the hole. In one example, the hole may be provided as a plurality of holes arranged in the first body 513 so as not to overlap a gas supply hole 575. Selectively, the holes may be provided in the second body 511. In one example, the holes may be arranged at the same distance from the gas supply hole 575 with respect to the center of the support unit 530.

The gas supply unit 570 prevents an atmosphere inside the treatment space 501 from leaking and prevents external air from being introduced into the treatment space 501. In one example, the gas supply unit 570 includes a gas supply line 571, a gas supply hole 572, and a gas supply source 577. The gas supply line 571 receives a gas from the gas supply source 577 and supplies the gas to the gas supply hole 572. A gas control valve 573 is installed in the gas supply line 571. The gas control valve 573 controls whether or not to supply the gas provided to the gas supply hole 572 and a supply flow rate. The gas supply hole 572 sprays the gas to the space between the first body 513 and the second body 511. In one example, the gas supply hole 572 sprays the gas to the facing side surfaces of the first body 513 and the second body 511. In one example, the gas supply hole 572 may be provided as a plurality of gas supply holes 572 in the first body 513. Selectively, the gas supply hole 572 may be provided as a plurality of gas supply holes 572 in the second body 511. In one example, the gas is provided as an inert gas. For example, the gas is provided as nitrogen. In one example, the plurality of gas supply holes 572 may be arranged at the same distance with respect to the center of the support unit 530.

Figure 5:
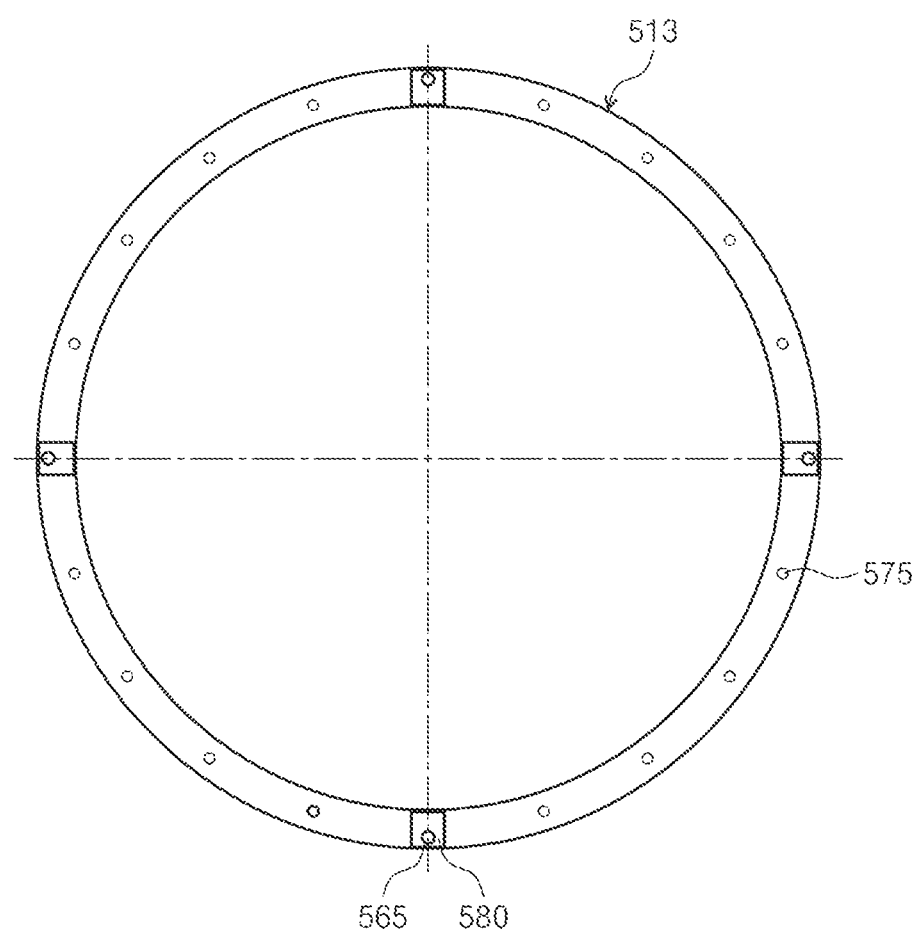
FIG. 5 is a plan view illustrating a first body according to one embodiment when viewed from a top.

The interval state detection unit 560 detects an interval state between a side wall of the first body 513 and a side wall of the second body 511 when the first body 513 and the second body 511 are placed in the process location. Referring to FIGS. 4 to 5, the interval state detection unit 560 includes a pressure provision line 561, a pressure measurement member 565, and an interval detection plate 580. In one example, the pressure provision line 561 provides a positive pressure or negative pressure between the side wall of the first body 513 and the side wall of the second body 511. In one example, a fluid hole 562 connected to the pressure provision line 561 is formed in the first body 513 or the second body 511. For example, the fluid hole 562 is formed in the second body 511.

The pressure provision line 561 includes a main line 5611 and a branch line 5612. The main line 5611 is connected to a pressure supply source 567. The pressure supply source 567 provides a pressure to the main line 5611. In one example, the pressure supply source 567 may supply a fluid to the main line 5611. In one example, the fluid may be provided as gas. For example, the fluid may be provided as air. Selectively, the pressure supply source 567 may be provided as a pressure reduction member to provide a pressure reduction force to the main line 5611. Hereinafter, it will be described that the pressure supply source 567 supplies air to the main line 5611 and the branch line 5612.

The branch line 5612 is branched off from the main line 5611 and connects the main line 5611 and the fluid hole 562 formed in the side wall of the first body 513. Selectively, the fluid hole 562 may be provided as one fluid hole 562, and the main line 5611 may be directly connected to the fluid hole 562. In one example, the branch lines 5612 may be provided to have the same length and the same diameter, and the pressures of fluids flowing in the branch lines 5612 may be provided the same.

The pressure measurement member 565 measures or detects a change in the pressure of the pressure provision line 561. In one example, the pressure measurement member 565 detects a change in the pressure of the branch line 5612. In one example, the pressure measurement member 565 includes a differential pressure gauge provided in the main line 5611. In one example, the differential pressure gauge may measure a pressure difference between the main line 5611 and the external air. Alternatively, the differential pressure gauge may measure a pressure difference between the main line 5611 and the branch line 5612. Selectively, the fluid hole 562 may be provided as one fluid hole 562, the main line 5611 may be directly connected to the fluid hole 562, and the pressure measurement member 565 may be provided to measure or detect a change in the pressure of the main line 5611.

The interval detection plate 580 is installed on a surface, facing the side wall of the second body 511, of the side wall of the first body 513. In one example, the interval detection plate 580 is placed on the first body 513. For example, the interval detection plate 580 may be coupled to the first body 513. Selectively, the interval detection plate 580 may be coupled to the second body 511. In one example, the fluid hole 562 formed in the first body 513 extends up to the interval detection plate 580. In one example, the pressure provision line 561 provides a positive pressure or negative pressure between the side wall of the first body 513 and the side wall of the second body 511 through the fluid hole 562 formed in the interval detection plate 580. For example, the pressure provision line 561 may supply air to the fluid hole 562 formed in the interval detection plate 580. The pressure provision line 561 sprays air in a vertical direction toward a surface in which the sides walls of the first body 513 and the second body 511 face each other.

In one example, the thickness of the interval detection plate 580 is provided to be the same as an interval between the side wall of the first body 513 and the side wall of the second body 511 facing each other in the process location. For example, the first body 513 and the second body 511 are placed in the process location while the substrate "W" is treated in the treatment space, and in the process location, an interval between the side wall of the first body 513 and the side wall of the second body 511 is maintained as a preset interval. Further, the thickness of the interval detection plate 580 is provided to be the same as the preset interval. Accordingly, in the process location, the interval detection plate 580 is in close contact with a gap between the first body 513 and the second body 511. Accordingly, in the process location, a predetermined pressure may be formed inside the main line 5611 and the branch line 5612.

The branch lines 5612 have the same diameter and the same length, and the same pressure is provided to the branch lines 5612. Accordingly, when an interval between the interval detection plate 580 and the side wall of the second body 511 is the same at all locations, the pressure formed inside the branch line 5612 is also the same. In one example, the interval detection plate 580 may be provided as a plurality of interval detection plates 580 along the side wall of the first body 513. For example, four interval detection plates 580 may be provided on the first body 513 at the same interval. Selectively, the number of the interval detection plates 580 may be less than or greater than four.

Hereinafter, a method of treating the substrate "W" using the substrate treating apparatus 500 according to the embodiment of the inventive concept will be described with reference to FIGS. 6 to 8.

Figure 6:
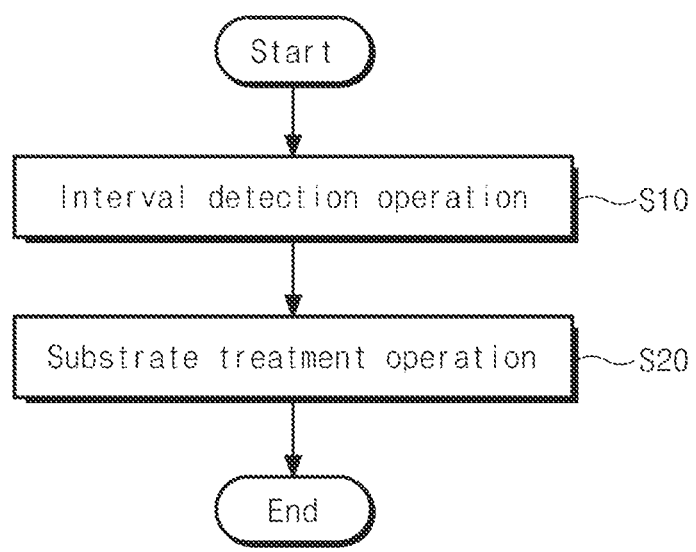
FIG. 6 is a flowchart illustrating a substrate treating method according to one embodiment of the inventive concept.
Figure 7:
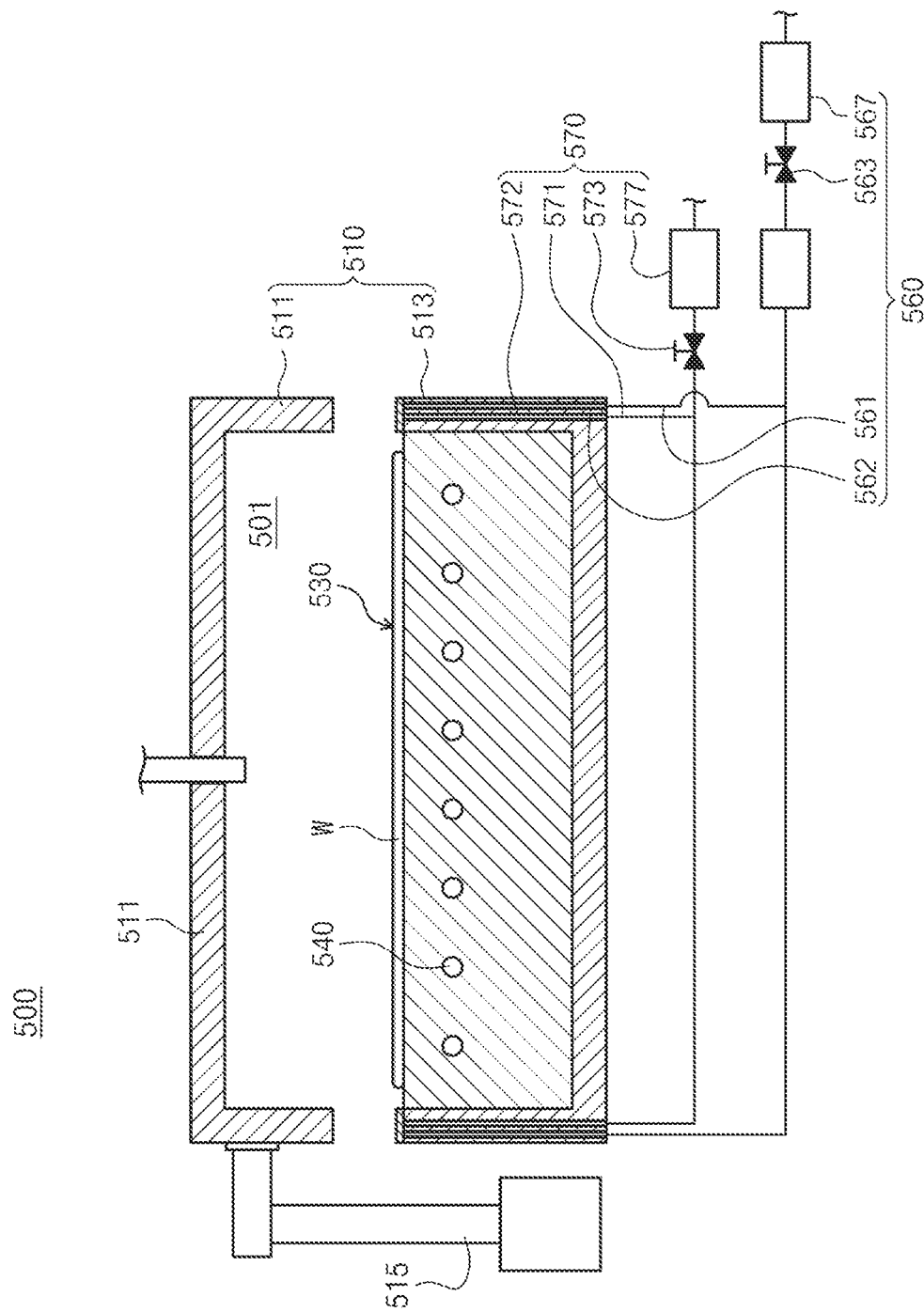
FIGS. 7 to 9 are views sequentially illustrating the substrate treating method according to one embodiment of the inventive concept.
Figure 8:
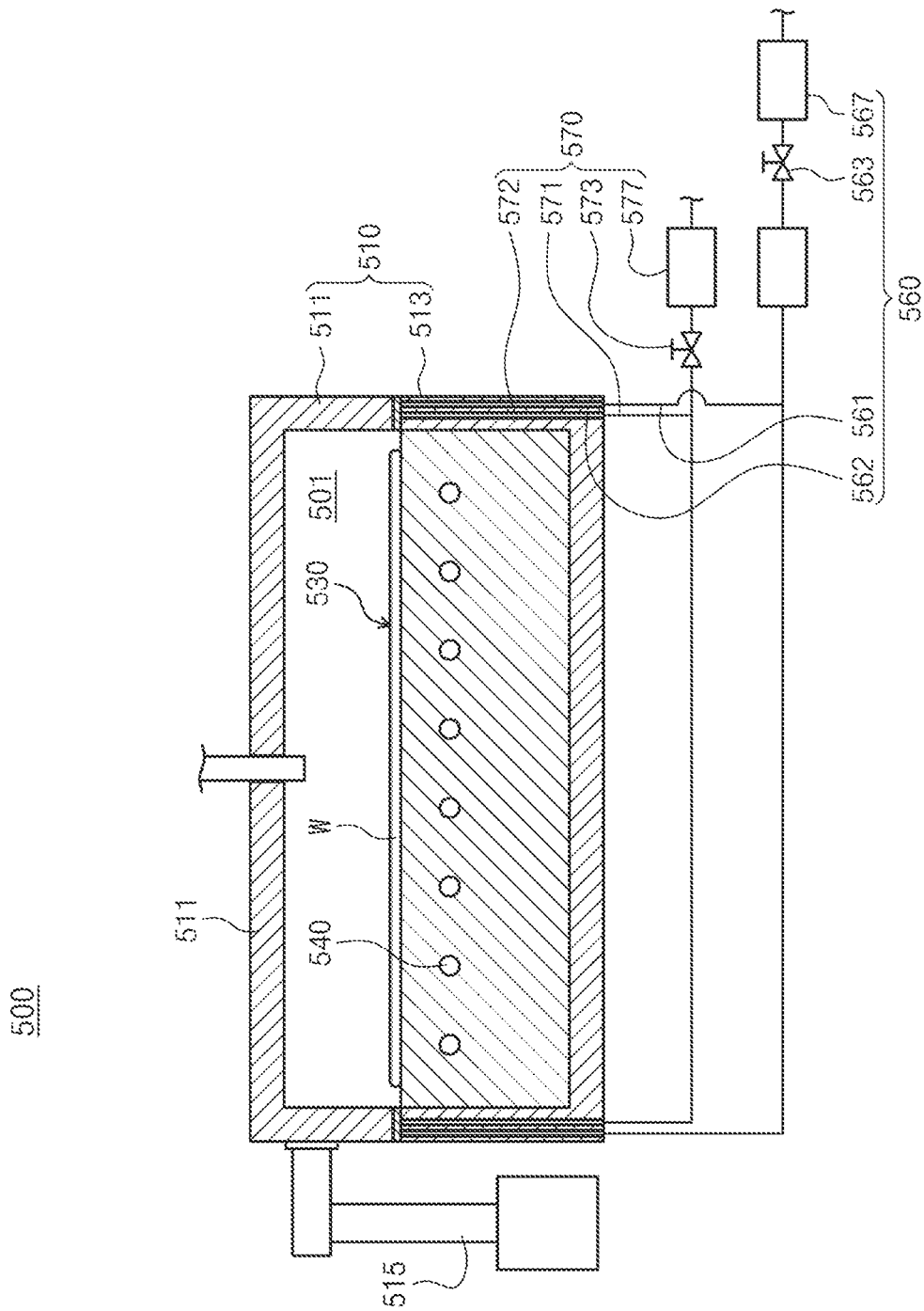
Figure 9:
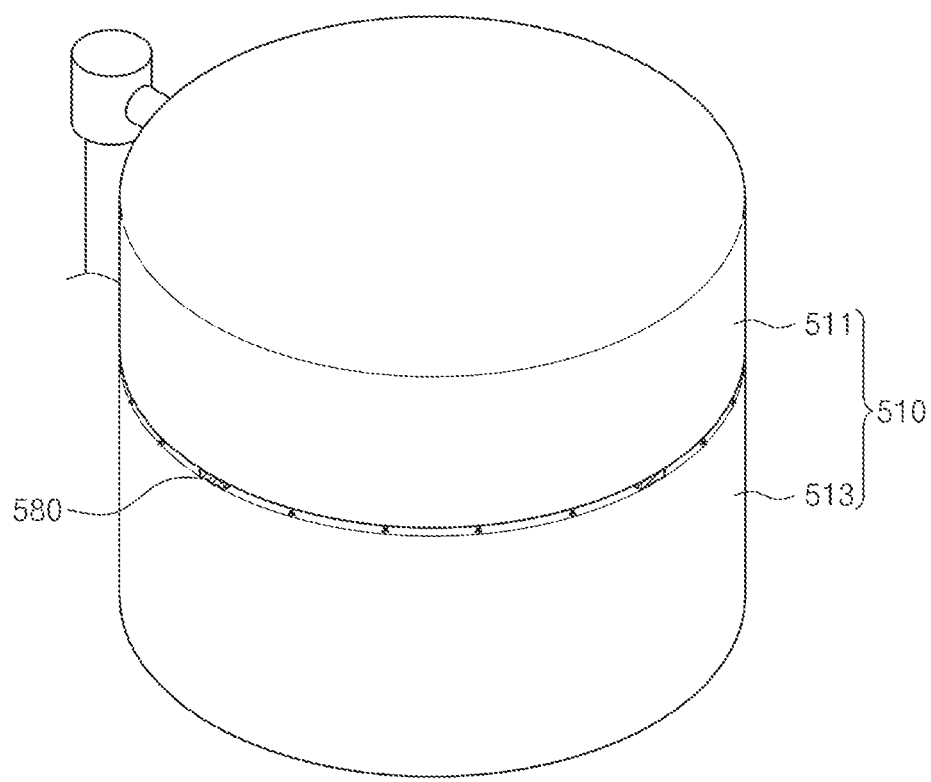

FIG. 6 is a flowchart illustrating a substrate treating method according to one embodiment of the inventive concept, and FIGS. 7 to 9 are views sequentially illustrating the substrate treating method according to one embodiment of the inventive concept. Referring to FIG. 6, the substrate treating method according to the inventive concept includes interval detection operation S10 and substrate treatment operation S20. Before interval detection operation S10, as illustrated in FIG. 7, the process chamber 510 is opened, and the substrate "W" transferred from the outside of the treatment space 501 is seated on the support unit 530.

After the substrate "W" is transferred, the second body 511 is lowered, and thus the process chamber 510 is situated in the process location, as illustrated in FIG. 8. When the process chamber 510 is situated in the process location, interval detection operation S10 starts. Selectively, while the second body 511 is lowered, interval detection operation S10 may start. In interval detection operation S10, it is determined whether or not the first body 513 and the second body 511 are spaced apart from each other by a preset interval and whether or not an interval between the first body 513 and the second body 511 is uniform on the facing side surfaces of the first body 513 and the second body 511.

When interval detection operation S10 starts, as illustrated in FIGS. 8 to 9, the driver 515 lowers the second body 511 until the interval between the first body 513 and the second body 511 becomes a preset interval. When interval detection operation S10 starts, air is supplied to the pressure provision line 561. Before interval detection operation S10, information on the pressure formed in the main line 5611 or the branch line 5612 is input to a controller when the interval between the first body 513 and the second body 511 is the preset interval. In one example, when the interval between the first body 513 and the second body 511 is the preset interval, information on a preset pressure formed in the main line 5611 is input to the controller.

Whether or not the first body 513 and the second body 511 are spaced apart from each other by the preset interval will be determined as follows. The controller controls the driver 515 so that a location of the second body 511 is adjusted until the pressure formed in the main line 5611 becomes a preset pressure. In one example, the information on the preset pressure may be information on a pressure measured by the differential pressure gauge. For example, the differential pressure gauge provided in the main line 5611 measures a pressure difference between the main line 5611 and the external air. When the interval between the first body 513 and the second body 511 is the preset interval, information on the pressure difference between the main line 5611 and the external air is input to the controller. When the pressure difference between the main line 5611 and the external air is not a preset pressure difference, the controller determines that the interval state is defective. In one example, when the measured pressure difference between the main line 5611 and the external air deviates from the preset pressure difference by a predetermined error range, the controller determines that a current state is defective. When it is determined that the interval state is defective, the controller controls the driver 515 so that the location of the second body 511 is adjusted until the pressure difference between the main line 5611 and the external air becomes the preset pressure difference. Accordingly, the second body 511 is located at a desired height.

Whether or not the interval between the first body 513 and the second body 511 is uniform will be determined as follows. The pressures of the air supplied to the branch lines 5612 are the same, and the diameters and the lengths of the branch lines 5612 are the same. Accordingly, when the interval between the first body 513 and the second body 511 is uniform on the facing side surfaces of the first body 513 and the second body 511, the pressures inside the branch lines 5612 are formed to be the same. When any part of the facing side surfaces of the first body 513 and the second body 511 has a different interval, a fluctuation occurs in the pressures inside some of the branch lines 5612. When a pressure fluctuation occurs in even one of the branch lines 5612, the pressure of the main line 5611 also fluctuates. When the pressure difference between the main line 5611 and the external air, measured by the differential pressure gauge, is different from the preset pressure difference, the controller determines that a current state is defective. In one example, when the measured pressure difference between the main line 5611 and the external air deviates from the preset pressure difference by the predetermined error range, the controller determines that a current state is defective. The controller controls the driver 515 so that the location of the second body 511 is adjusted until the pressure difference between the main line 5611 and the external air becomes the preset pressure difference. In one example, the driver 515 may be provided as a plurality of cylinders providing a pneumatic pressure, and the controller may adjust the pneumatic pressures of the respective cylinders. Accordingly, the interval between the first body 513 and the second body 511 is uniform.

In one example, interval detection operation S10 may be continuously performed even while substrate treatment operation S20 is performed. That is, it is continuously determined whether or not the locations of the first body 513 and the second body 511 are appropriate while the substrate "W" is treated in the process chamber 510.

It has been described in the above example that the driver 515 adjusts the location of the second body 511 according to a command of the controller. However, selectively, the operator instead of the driver 515 may adjust the location of the first body 513 or the second body 511.

It has been described in the above example that the interval state detection unit 560 is provided in the first body 513. However, in another example, the interval state detection unit 560 may be provided in the second body 511.

It has been described in the above example that the differential pressure gauge is provided in the main line 5611. However, unlike this, pressure gauges that measure the pressures of the branch lines 5612 may be provided. Alternatively, a pressure gauge that measures the pressure of the main line 5611 may be provided.

Figure 10:
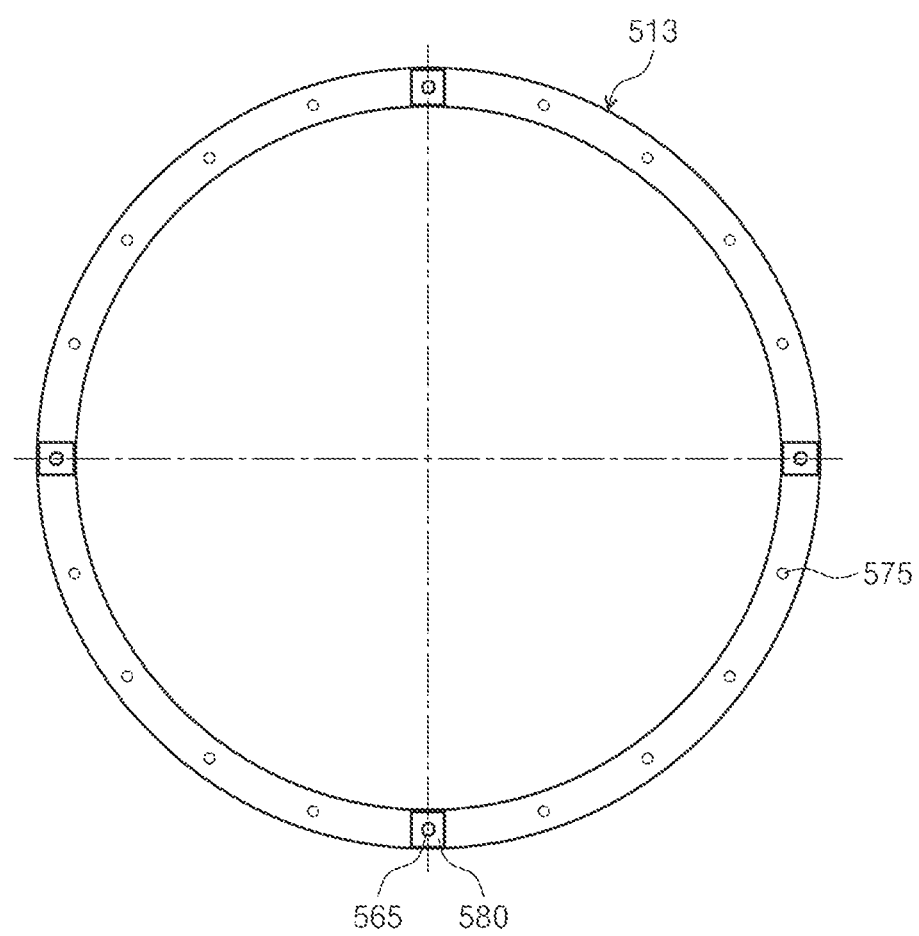
FIGS. 10 to FIG. 11 are views illustrating a first body according to another embodiment when viewed from the top.

It has been described in the above example that the distance between the fluid hole 562 and the center of the support unit 530 and the distance between the gas supply hole 575 and the center of the support unit 530 are different from each other. However, unlike this, as illustrated in FIG. 10, the distance between the fluid hole 562 and the center of the support unit 530 and the distance between the gas supply hole 575 and the center of the support unit 530 may be the same.

Figure 11:
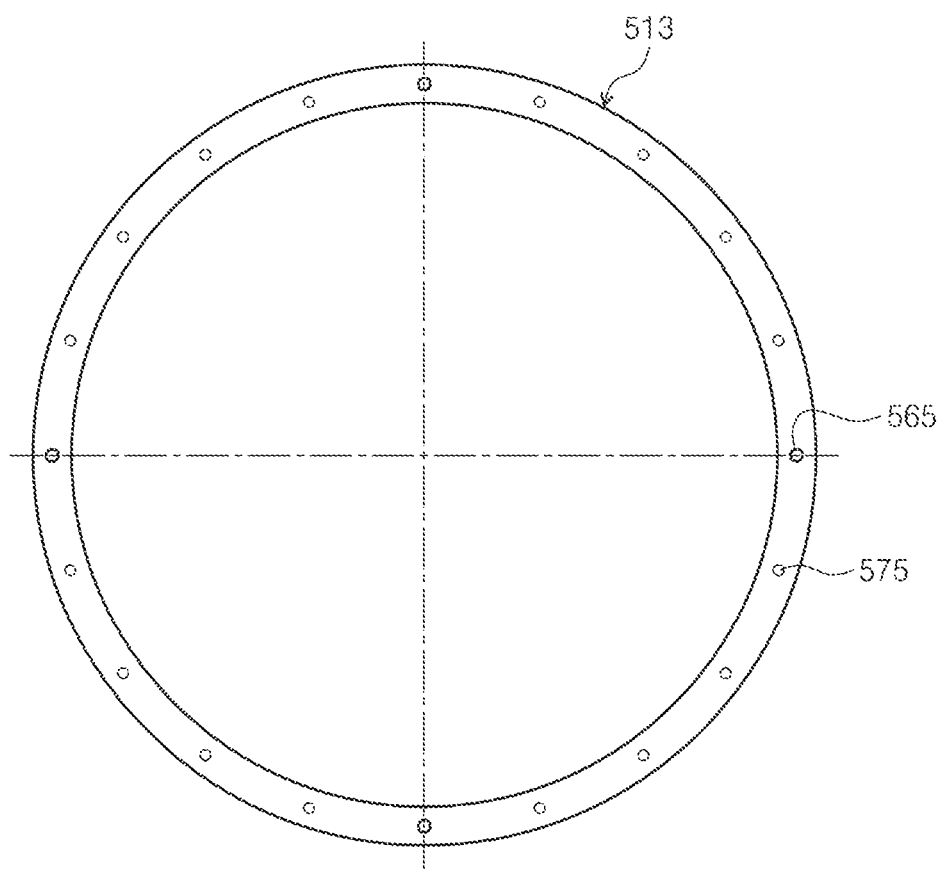

It has been described in the above example that the interval detection plate 580 is provided. However, unlike this, as illustrated in FIG. 11, the interval detection plate 580 may not be provided. In an embodiment illustrated in FIG. 11, as described above, the first body 513 and the second body 511 may perform substrate treatment operation S20 while being spaced apart from each other. Selectively, the first body 513 and the second body 511 may perform substrate treatment operation S20 while being in close contact with each other.

According to the inventive concept, it may be identified whether or not an interval between the process chambers 510 is a preset interval. Further, it may be identified whether or not the interval between the process chambers 510 is uniform.

Referring back to FIGS. 2 and 3, the liquid treating chamber 3600 is provided as a plurality of liquid treating chambers 3600. Some of the liquid treating chambers 3600 may be provided to be stacked on each other. The liquid treating chambers 3600 are arranged on one side of the transfer chamber 3402. The liquid treating chambers 3600 are arranged side by side in the first direction 12. Some of the liquid treating chambers 3600 are provided at a location adjacent to the index module 20. Hereinafter, these liquid treating chambers are referred to as front liquid treating chambers 3602. The other liquid treating chambers 3600 are provided at a location adjacent to the interface module 40. Hereinafter, these liquid treating chambers are referred to as rear liquid treating chambers 3604.

The front liquid treating chamber 3602 applies a first liquid onto the substrate "W", and the rear liquid treating chamber 3604 applies a second liquid onto the substrate "W". The first liquid and the second liquid may be different from each other. According to one embodiment, the first liquid is an anti-reflective film, and the second liquid is a photoresist. The photoresist may be applied onto the substrate "W" onto which the anti-reflective film is applied. Selectively, the first liquid is a photoresist, and the second liquid is an anti-reflective film. In this case, the anti-reflective film may be applied onto the substrate "W" onto which the photoresist is applied. Selectively, the first liquid and the second liquid may be the same liquid, and both the first liquid and the second liquid may be a photoresist.

The buffer chamber 3800 is provided as a plurality of buffer chambers 3800. Some of the buffer chambers 3800 are arranged between the index module 20 and the transfer chamber 3400. Hereinafter, these buffer chambers are referred to as front buffers 3802. The front buffers 3802 are provided as a plurality of front buffers 3802 and located to be vertically stacked on each other. The other buffer chambers 3800 are arranged between the transfer chamber 3400 and the interface module 40. Hereinafter, these buffer chambers are referred to as rear buffers 3804. The rear buffers 3804 are provided as a plurality of rear buffers 3804 and located to be vertically stacked on each other. The front buffers 3802 and the rear buffers 3804 temporarily store a plurality of substrates "W". The substrate "W" stored in the front buffer 3802 is carried in or out by the index robot 2200 and the transfer robot 3422. The substrate "W" stored in the rear buffer 3804 is carried in or out by the transfer robot 3422 and a first robot 4602.

The development block 30*b* has the heat treating chamber 3200, the transfer chamber 3400, and the liquid treating chamber 3600. The heat treating chamber 3200, the transfer chamber 3400, and the liquid treating chamber 3600 of the development block 30*b* may be provided in a structure and arrangement substantially similar to those of the heat treating chamber 3200, the transfer chamber 3400, and the liquid treating chamber 3600 of the application block 30*a*. However, in the development block 30*b*, the liquid treating chambers 3600 are provided as development chambers 3600 that develop the substrate "W" by supplying a developer in the same manner.

The interface module 40 connects the treating module 30 to an external exposure device 50. The interface module 40 has an interface frame 4100, an additional process chamber 4200, an interface buffer 4400, and a transfer member 4600.

A fan filter unit (not illustrated) that forms a downdraft therein may be provided at an upper end of the interface frame 4100. The additional process chamber 4200, the interface buffer 4400, and the transfer member 4600 are arranged inside the interface frame 4100. The additional process chamber 4200 may perform a predetermined additional process before the substrate "W" completely processed in the application block 30*a* is carried in the exposure device 50. Selectively, the additional process chamber 4200 may perform a predetermined additional process before the substrate "W" completely processed in the exposure device 50 is carried in the development block 30*b*. According to one example, the additional process may include an edge exposure process of exposing an edge region of the substrate "W", an upper surface cleaning process of cleaning an upper surface of the substrate "W", and a lower surface cleaning process of cleaning a lower surface of the substrate "W". The additional process chamber 4200 may be provided as a plurality of additional process chambers 4200, which may be provided to be stacked on each other. All the additional process chambers 4200 may be provided to perform the same process. Selectively, some of the additional process chambers 4200 may be provided to perform different processes.

The interface buffer 4400 provides a space in which the substrate "W", which is transferred between the application block 30a, the additional process chamber 4200, the exposure device 50, and the development block 30b, temporarily stays during the transferring. The interface buffer 4400 may be provided as a plurality of interface buffers 4400, and the plurality of interface buffers 4400 may be provided to be stacked on each other.

According to one example, with respect to an extension line of the transfer chamber 3400 in a lengthwise direction, the additional process chamber 4200 may be disposed on one side thereof and the interface buffer 4400 may be disposed on the other side thereof.

The transfer member 4600 transfers the substrate "W" between the application block 30a, the additional process chamber 4200, the exposure device 50, and the development block 30b. The transfer member 4600 may be provided as one or more robots. According to one example, the transfer member 4600 has the first robot 4602 and a second robot 4606. The first robot 4602 may be provided to transfer the substrate "W" between the application block 30a, the additional process chamber 4200, and the interface buffer 4400, an interface robot 4604 may be provided to transfer the substrate "W" between the interface buffer 4400 and the exposure device 50, and the second robot 4606 may be provided to transfer the substrate "W" between the interface buffer 4400 and the development block 30b.

The first robot 4602 and the second robot 4606 each include a hand on which the substrate "W" is placed, and the hand may be provided to move forward or rearward, rotate about an axis parallel to the third direction 16, and move along the third direction 16.

All the hands of the index robot 2200, the first robot 4602, and the second robot 4606 may be provided to have the same shape as that of the hand 3420 of the transfer robots 3422 and 3424. Selectively, the hand of a robot that directly moves the substrate "W" to or from a transfer plate 3240 of the heat treating chamber 3200 may be provided to have the same shape as that of the hand 3420 of the transfer robots 3422 and 3424, and the hand of the other robot may be provided to have a different shape.

According to one embodiment, the index robot 2200 may be provided to directly move the substrate "W" to or from the heating unit 3230 of the heat treating chamber 3200 provided in the application block 30a.

Further, the transfer robot 3422 provided in the application block 30a and the development block 30b may be provided to directly move the substrate "W" to or from the transfer plate 3240 located in the heat treating chamber 3200.

According to an embodiment of the inventive concept, it can be identified whether or not an interval between process chambers is a preset interval.

Further, according to the inventive concept, it can be identified whether or not the interval between the process chambers is uniform.

The effects of the inventive concept are limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
a process chamber having a first body and a second body which are combined with each other to have a treatment space therein;
a support unit located inside the treatment space and supporting a substrate;
a heating unit configured to heat the substrate placed on the support unit;
a driver configured to move any one of the first body and the second body to move the first body and the second body between a process location and an open location;
an interval state detection unit configured to detect an interval state between a side wall of the first body and a side wall of the second body when the first body and the second body are placed in the process location; and
a controller configured to control the driver and the interval state detection unit,
wherein the interval state detection unit includes:
a pressure provision line configured to provide a positive pressure or a negative pressure between the side wall of the first body and the side wall of the second body; and
a pressure measurement member configured to measure a change in a pressure of the pressure provision line, and
wherein the controller determines whether or not the interval state is defective on the basis of the pressure measured by the pressure measurement member.

2. The substrate treating apparatus of claim 1, wherein when it is determined that the interval state is defective, the controller controls the driver and the interval state detection unit so that the first body or the second body is moved.

3. The substrate treating apparatus of claim 1, wherein the pressure provision line includes:
a main line connected to a pressure supply source; and
a branch line branched off from the main line and connecting the main line and a fluid hole provided in the side wall of the first body.

4. The substrate treating apparatus of claim 3, wherein pressures of fluids flowing in the branch lines are the same.

5. The substrate treating apparatus of claim 3, wherein the pressure supply source supplies a fluid to the main line.

6. The substrate treating apparatus of claim 5, wherein the interval state detection unit sprays the fluid in a vertical direction toward a surface on which the side walls of the first body and the second body face each other.

7. The substrate treating apparatus of claim 3, wherein the pressure supply source is a pressure reduction member.

8. The substrate treating apparatus of claim 3, wherein the interval state detection unit further includes an interval detection plate installed on a surface, facing the side wall of the second body, of the side wall of the first body, wherein the pressure provision line provides the positive pressure or the negative pressure between the side wall of the first body and the side wall of the second body through a fluid hole formed in the interval detection plate.

9. The substrate treating apparatus of claim 8, wherein a thickness of the interval detection plate is the same as an interval between the side wall of the first body and the side wall of the second body facing each other in the process location.

10. The substrate treating apparatus of claim 8, wherein a plurality of interval detection plates are provided along the side wall of the first body.

11. The substrate treating apparatus of claim 1, wherein the pressure measurement member includes a differential pressure gauge configured to measure a pressure difference between the pressure provision line and external air.

12. The substrate treating apparatus of claim 1, wherein the controller controls the driver so that, while the substrate is treated inside the treatment space, an interval between the side wall of the first body and the side wall of the second body is maintained in a preset interval.

13. The substrate treating apparatus of claim 12, further comprising:
   a gas supply unit configured to form a gas curtain by spraying gas to the first body or the second body toward facing side surfaces of the first body and the second body,
   wherein the gas supply unit includes:
   a plurality of gas supply holes formed in a side surface of the first body or the second body; and
   a gas supply line connected to a gas supply source and configured to supply the gas to the gas supply holes.

14. The substrate treating apparatus of claim 12, wherein the treating of the substrate is bake treatment.

15. A substrate treating apparatus comprising:
   a process chamber having an upper body and a lower body which are combined with each other to have a treatment space therein in which bake treatment is performed on a substrate;
   a support unit located inside the treatment space and supporting the substrate;
   a heating unit configured to heat the substrate placed on the support unit;
   a driver configured to move any one of the upper body and the lower body to move the upper body and the lower body between a process location and an open location;
   an interval state detection unit configured to detect an interval state between a side wall of the upper body and a side wall of the lower body when the upper body and the lower body are placed on the process location; and
   a controller configured to control the driver and the interval state detection unit,
   wherein the interval state detection unit includes:
   a pressure provision line configured to provide a fluid in a vertical direction toward a surface on which the side wall of the upper body and the side wall of the lower body face each other; and
   a pressure measurement member configured to measure a change in a pressure of the pressure provision line,
   wherein the pressure provision line includes:
   a main line connected to a pressure supply source; and
   a branch line branched off from the main line and connecting the main line and a fluid hole formed in the side wall of the upper body,
   wherein the pressure measurement member measures a change in a pressure of the branch line,
   wherein the interval state detection unit further includes:
   an interval detection plate installed on a surface, facing the side wall of the lower body, of the side wall of the upper body,
   wherein the pressure provision line provides the fluid between the side wall of the upper body and the side wall of the lower body through a fluid hole formed in the interval detection plate,
   wherein a thickness of the interval detection plate is provided to be the same as an interval between the side wall of the upper body and the side wall of the lower body facing each other in the process location,
   wherein the controller controls the driver and the interval state detection unit so that, while the substrate is treated inside the treatment space, an interval between the upper body and the lower body is maintained in a preset interval, and so that an interval state is determined on the basis of the pressure measured by the pressure measurement member, and when it is determined that the interval state is defective, the upper body or the lower body is moved.

* * * * *